(12) United States Patent
Hoppe

(10) Patent No.: US 11,391,761 B2
(45) Date of Patent: Jul. 19, 2022

(54) CURRENT CONVERTER

(71) Applicant: Siemens Aktiengesellschaft, Munich (DE)

(72) Inventor: Lars Hoppe, Bamberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 16/966,117

(22) PCT Filed: Jan. 3, 2019

(86) PCT No.: PCT/EP2019/050074
§ 371 (c)(1),
(2) Date: Jul. 30, 2020

(87) PCT Pub. No.: WO2019/149463
PCT Pub. Date: Aug. 8, 2019

(65) Prior Publication Data
US 2021/0041484 A1 Feb. 11, 2021

(30) Foreign Application Priority Data
Jan. 30, 2018 (DE) ................. 10 2018 201 359.4

(51) Int. Cl.
G01R 15/18 (2006.01)
G01R 15/20 (2006.01)
G01R 19/00 (2006.01)
H01F 38/30 (2006.01)

(52) U.S. Cl.
CPC ......... *G01R 15/185* (2013.01); *G01R 15/202* (2013.01); *G01R 19/0092* (2013.01); *H01F 38/30* (2013.01)

(58) Field of Classification Search
CPC .............. G01R 15/185; G01R 15/202; G01R 19/0092; H01F 38/30
See application file for complete search history.

(56) References Cited

U.S. PATENT DOCUMENTS 3,380,009 A 4/1968 Miller
4,682,101 A 7/1987 Cattaneo
(Continued)

FOREIGN PATENT DOCUMENTS

DE 16 13 798 A1 5/1971
DE 10 2015 214 043 A1 6/2016
(Continued)

OTHER PUBLICATIONS

PCT International Search Report and Written Opinion of International Searching Authority dated Dec. 4, 2019 corresponding to PCT International Application No. PCT/EP/2019/050074 filed Mar. 1, 2019.
(Continued)

*Primary Examiner* — Dominic E Hawkins
(74) *Attorney, Agent, or Firm* — Laurence A. Greenberg; Werner H. Stemer; Ralph E. Locher

(57) ABSTRACT

A current converter contains a primary conductor, a housing through which the primary conductor is led, an inductive alternating-current sensor which has at least one secondary coil arranged in the housing, and a compensation current sensor having a compensation coil arranged in the housing for producing a compensation magnetic field, which compensates a primary magnetic field produced by the primary conductor. A magnetometer is further provided for detecting a sum of the primary magnetic field and the compensation magnetic field.

13 Claims, 2 Drawing Sheets

(56) References Cited

U.S. PATENT DOCUMENTS

| | | | | |
|---|---|---|---|---|
| 5,128,608 A | * | 7/1992 | Ochi | G01R 15/24 |
| | | | | 324/117 R |
| 5,473,244 A | * | 12/1995 | Libove | G01R 1/22 |
| | | | | 324/126 |
| 6,984,979 B1 | | 1/2006 | Edel | |
| 8,686,716 B2 | * | 4/2014 | Peretto | G01R 15/181 |
| | | | | 324/127 |
| 9,964,566 B2 | * | 5/2018 | Li | G01R 3/00 |
| 2015/0331015 A1 | * | 11/2015 | Lee | G01R 15/185 |
| | | | | 324/117 R |
| 2017/0219632 A1 | | 8/2017 | Teppan et al. | |

FOREIGN PATENT DOCUMENTS

| | | |
|---|---|---|
| DE | 10 2012 213 802 B4 | 12/2017 |
| EP | 0 194 225 B1 | 9/1989 |
| EP | 2 980 597 A1 | 2/2016 |
| RU | 2321000 C2 | 3/2008 |

OTHER PUBLICATIONS

When interruption is unacceptable PM Special Measuring Systems A Phoenix Mecano Company www.pm-sms.com May 2016 http://www.pm-sms.com/wp-content/uploads/2016/06/Flyer-HVDC.pdf;.
Gas-insulated Instrument Transformers for outdoor Installation TRENCH E 216.11 Apr. 2000 pp. 1-12 www.trenchgroup.com; 2000.

\* cited by examiner

CURRENT CONVERTER

BACKGROUND OF THE INVENTION

Field of the Invention

The invention relates to a current converter and to a method for measuring currents using such a current converter.

In particular, the invention relates to current converters for high- and medium-voltage grids. In AC grid systems, inductive current converters are generally employed, which are based upon the transformer principle. However, these inductive current converters cannot detect any direct currents or direct current components in mixed currents. In particular, the detection of direct currents or direct current components is necessary for the monitoring of power grids which incorporate high-voltage direct current transmission sections. Grid systems of this type are increasingly significant, particularly for the low-loss transmission of electrical energy over long distances.

SUMMARY OF THE INVENTION

The object of the invention is the disclosure of an improved current converter and of an improved method for measuring currents, particularly with respect to the detection of alternating currents and direct currents.

According to the invention, this object is fulfilled by a current converter having the characteristics of the independent device claim, and by a method having the characteristics of the independent method claim 8.

Advantageous configurations of the invention are the subject matter of the sub-claims.

A current converter according to the invention comprises a primary conductor, a housing through which the primary conductor is led, an inductive alternating current sensor having at least one secondary coil which is arranged in the housing, and a compensation current sensor having a compensation coil which is arranged in the housing for producing a compensation magnetic field, which compensates a primary magnetic field produced by the primary conductor, and having a magnetometer for detecting a sum of the primary magnetic field and the compensation magnetic field.

A current converter according to the invention permits the detection of both alternating currents or alternating current components in mixed currents, and of direct currents or direct current components in mixed currents.

For the detection of alternating currents and alternating current components of mixed currents, the current converter particularly incorporates an inductive alternating current sensor, which is based upon the transformer principle: an alternating current or alternating current component flowing in the primary conductor generates a temporally varying primary magnetic field, which induces a secondary voltage and a secondary current in the secondary coil, by means of which the alternating current or alternating current component flowing in the primary conductor can be detected.

Additionally, the current converter incorporates a compensation current sensor by means of which, in particular, direct currents and direct current components of mixed currents can be detected: a primary current flowing in the primary conductor generates a primary magnetic field in the environment of primary conductor; a compensation current setting is applied to the compensation coil for the generation of a compensation magnetic field which compensates the primary magnetic field at the location of the magnetometer, and by means of which the primary current is detected.

Consequently, a current converter according to the invention can be particularly advantageously employed for the monitoring of grid systems having direct and alternating currents, or mixed currents, in which the employment of separate direct current and alternating current converters would otherwise be required. The compensation coil of the compensation current sensor can thus be installed in the same housing as the at least one secondary coil of the inductive alternating current sensor such that, for the construction of a current converter according to the invention, a housing construction method can be employed which is known from conventional inductive alternating current converters and is proven in the latter. A current converter according to the invention can be constructed separately, or can be a constituent of a combined current and voltage converter.

According to one configuration of the invention, it is provided that the inductive alternating current sensor comprises at least one measuring core and/or at least one protective core. A measuring core or protective core is to be understood as a soft magnetic magnet core of a secondary coil. Measuring and protective cores do not differ from one another in principle, but only with respect to their design for measurement or protective purposes. The employment of measuring cores and protective cores permits the concentration of the primary magnetic field generated by the primary conductor at the location of said cores.

According to a further configuration of the invention, it is provided that the magnetometer is a fluxgate magnetometer. In particular, the fluxgate magnetometer can comprise two compensation cores configured in an annular arrangement about the primary conductor within the housing, and an excitation winding wound in the inverse direction about the two compensation cores. Fluxgate magnetometers provide an advantage over other magnetometers, for example over Hall effect sensors, in that they deliver signals with no offset, or with only a limited offset. Moreover, they can substantially be produced from the same components and materials as inductive alternating current sensors, such that it is not necessary to provide any separate and complex protective devices for the protection of the components thereof in the housing. Fluxgate magnetometers with two compensation cores, about which an excitation winding is wound in the inverse direction, further provide an advantage in that perturbations of the primary conductor by the compensation cores are substantially mutually compensated.

It can further be provided that the fluxgate magnetometer comprises an additional core and an additional secondary winding, which are configured in an annular arrangement about the primary conductor, externally to the two compensation cores within the housing, and the additional secondary winding and the compensation coil are wound about the additional core. By means of the additional core and the additional secondary winding, the compensation current sensor can also be employed for the detection of alternating currents or alternating current components, for example for the detection of alternating currents or alternating current components, for the measurement of which the inductive alternating current sensor is not designed and which, additionally, cannot be detected by the two compensation cores.

Alternatively, the compensation current sensor, in place of a fluxgate magnetometer, can comprise a magnetometer with a Hall effect sensor. For example, the compensation current sensor can comprise a magnet core which is configured in an annular arrangement about the primary conductor, within the housing, about which the compensation coil is wound, and which incorporates an air gap in which the Hall effect sensor is arranged. By means of the Hall effect sensor, this permits the sum of the primary magnetic field which is generated by the primary conductor and the compensation magnetic field which is generated by the compensation coil to be detected at the location of the Hall effect sensor, and the setting of the compensation current flowing in the compensation coil to be adjusted such that this sum is cancelled out. By the arrangement of the Hall effect sensor in the air gap of a magnet core, about which the compensation coil is wound, the magnetic field is advantageously concentrated at the location of the Hall effect sensor.

According to a further configuration of the invention, it is provided that a winding housing is arranged in the housing, within which the at least one secondary coil and the compensation coil are arranged. By means of the winding housing, which is also described as a core shell, an electrical potential can be established in the environment of the secondary and compensation coils wherein, for example, the winding housing is grounded.

The winding housing is preferably electrically insulated vis-á-vis the housing. For example, the housing is filled with an insulating gas or an insulating fluid, or with an insulating compound. It is thus prevented that an electrical voltage which is present on the housing, in particular a high voltage, is transmitted to the winding housing.

According to further configurations of the invention, it is provided that the inductive alternating current sensor comprises a first measuring circuit, which is arranged outside the housing and is electrically connected to each secondary coil, and/or that the compensation current sensor comprises a second measuring circuit, which is arranged outside the housing and is electrically connected to the compensation coil and the magnetometer. These configurations of the invention provide for the arrangement of the measuring circuits of the current converter externally to the housing. As a result, the measuring circuits can advantageously be arranged in protected and easily-accessible locations, for example in a switch cabinet.

According to a further configuration of the invention, it is provided that the compensation current sensor is deactivable wherein, in particular, the compensation coil is short-circuitable. This configuration of the invention takes account of the fact that a compensation current sensor requires electrical energy for the supply of the compensation coil and the magnetometer. It is therefore advantageous that the compensation current sensor should be configured in a deactivable manner, such that it is possible for the latter only to be activated when required, particularly where a direct current or a direct current component is to be detected. The energy consumption and operating costs of the current converter can advantageously be reduced as a result. Moreover, procurement costs or initial procurement costs for the current converter can be reduced, wherein a measuring circuit for the compensation current sensor is only procured if required and, potentially, is only additionally procured at a later date.

A further configuration of the invention provides for a post insulator, upon which the housing is arranged. This configuration of the invention is particularly advantageous where a high voltage is present on the primary conductor, in order to ensure that the housing and the primary conductor are arranged at a sufficient height, and are electrically insulated from the ground.

In the method according to the invention for measuring currents by means of a current converter according to the invention, an alternating current or an alternating current component of a current flowing in the primary conductor is detected by means of the inductive alternating current sensor and, by means of the compensation current sensor, a direct current or a direct current component of a current flowing in the primary conductor is detected.

The above-mentioned properties, characteristics and advantages of the present invention, and the manner in which these are achieved, are elucidated and clarified by reference to the following description of the exemplary embodiments, which are described in greater detail with reference to the drawings.

DETAILED DESCRIPTION OF THE INVENTION

Mutually corresponding components are identified in the figures by the same reference numbers.

Figure 1:
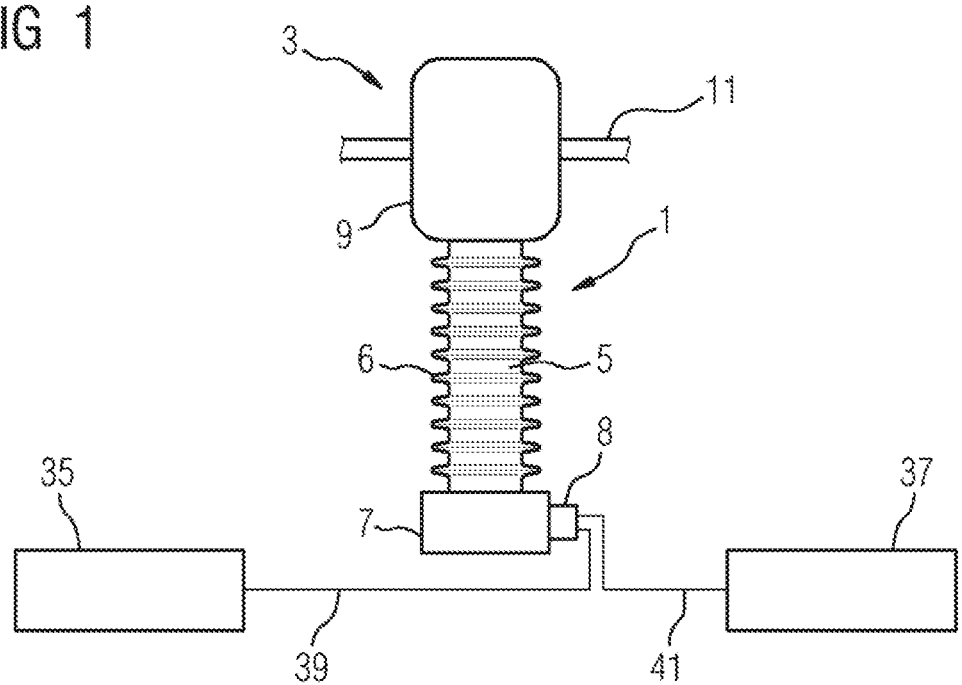
FIG. 1 shows a schematic representation of an exemplary embodiment of a current converter.

FIG. 1 shows a schematic representation of an exemplary embodiment of a current converter 1. The current converter 1 comprises a current converter head 3, a post insulator 5, upon which the current converter head 3 is arranged, and a pedestal 7, upon which the post insulator 5 is arranged and on which a terminal box 8 is arranged.

Figure 2:
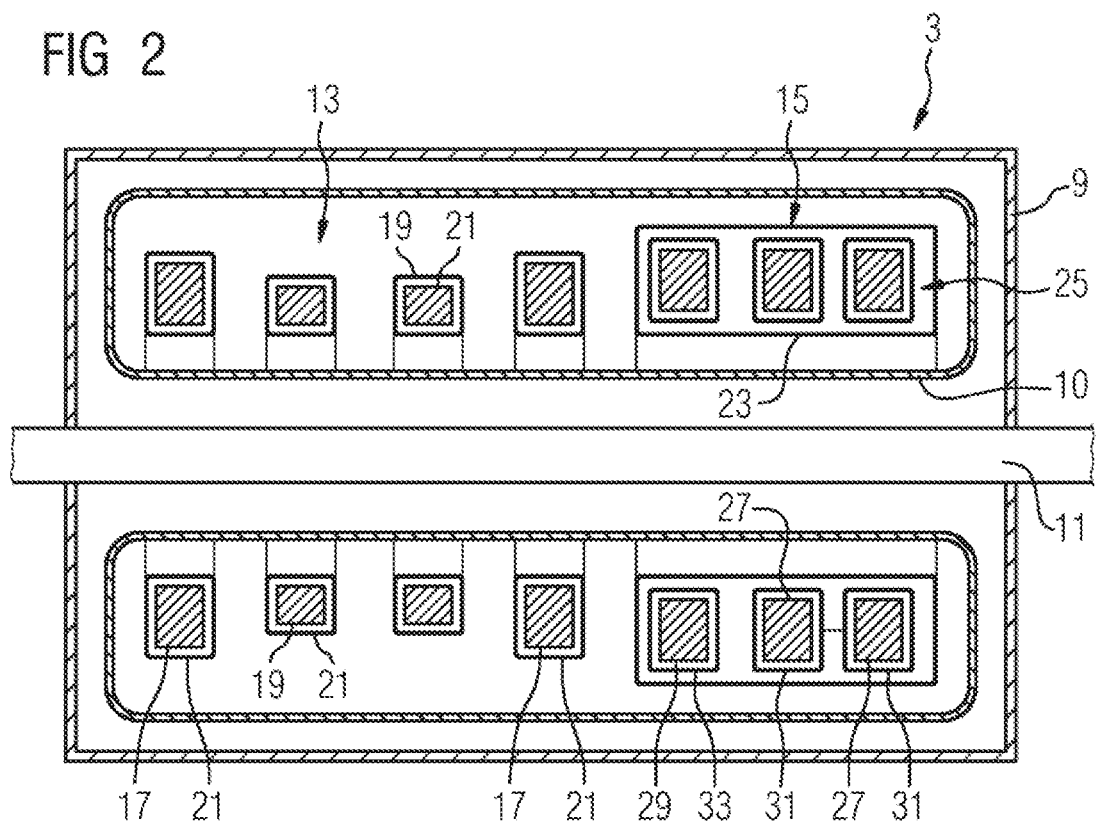
FIG. 2 shows a schematic sectional representation of a current converter head of the current converter represented in FIG. 1.

FIG. 2 shows a schematic sectional representation of the current converter head 3. The current converter head 3 comprises a housing 9, through which a primary conductor 11 is led. In the housing 9, a torus-shaped winding housing 10 is configured, which is arranged around the primary conductor 11.

The current converter 1 comprises an inductive alternating current sensor 13 and a compensation current sensor 15.

The inductive alternating current sensor 13 of the present exemplary embodiment comprises two annular protective cores 17 and two annular measuring cores 19, upon each of which a secondary coil 21 is wound and each of which is arranged about the primary conductor 11 within the winding housing 10.

The compensation current sensor 15 comprises a compensation coil 23 and a magnetometer 25. In the present exemplary embodiment, the magnetometer 25 is configured as a fluxgate magnetometer, and comprises two soft magnetic compensation cores 27, an optional soft magnetic additional core 29, an excitation winding 31 and an optional additional secondary winding 33. The compensation cores 27 and the additional core 29 respectively assume an annular configuration, and are arranged about the primary conductor 11 within the winding housing 10. The excitation winding 31 is wound in the inverse direction about the two compensation cores 27. The additional secondary winding 33 is wound about the additional core 29. The compensation coil 23 is wound about the two compensation cores 27 and the additional core 29.

In the operation of the compensation current sensor 15, an alternating excitation current is generated in the excitation winding 31, which periodically drives the compensation cores 27 to a state of magnetic saturation. As the excitation winding 31 is wound in the inverse direction about the two compensation cores 27, the magnetic fields of the compensation cores 27 thus generated are in mutual opposition. The compensation cores 27, and the turns of the excitation winding 31 arranged about the latter, are identical, including with respect to the winding directions thereof, such that the magnetic fields of the compensation cores 27 are of equal magnitude, where no external magnetic field is acting upon said compensation cores 27. However, if an external magnetic field is acting on the compensation cores 27, this results in mutually differing magnitudes of the magnetic fields of said compensation cores 27, the difference in which constitutes a measure of the magnetic field strength of the external magnetic field. The external magnetic field acting on the compensation cores 27 is the sum of a primary magnetic field generated by a primary current in the primary conductor 11, and of a compensation magnetic field generated by a compensation current in the compensation coil 23. The setting of the compensation current in the compensation coil 23 is adjusted such that the compensation magnetic field compensates the primary magnetic field in the compensation cores 27, or the magnetic fields of the compensation cores 27 are of equal magnitude. The current strength of the compensation current thus constitutes a measure of the current strength of the primary current, and permits the measurement thereof. The function of the compensation cores 27 is the measurement of direct currents or direct current components flowing in the primary conductor 11.

The optional additional core 29 is employed for the additional measurement of alternating currents or alternating current components flowing in the primary conductor 11, for example for the measurement of alternating currents or alternating current components, for the measurement of which the measuring cores 19 of the inductive alternating current sensor 13 are not designed. Thus, by means of the compensation current in the compensation coil 23, primary magnetic fields are also compensated which are generated in the additional core 29 by alternating currents or alternating current components flowing in the primary conductor 11. Alternating current components of the primary current and the compensation current generate changes in a magnetic field in the additional core 29, which induces a secondary current in the additional secondary winding 33. The setting of the alternating current component of the compensation current is therefore adjusted such that no secondary current is induced in the additional secondary winding 33.

For the detection of secondary currents flowing in the secondary coils 21, which are induced by an alternating current or an alternating current component flowing in the primary conductor 11, the inductive alternating current sensor 13 comprises a first measuring circuit 35. For the generation of the excitation current flowing in the excitation winding 31, the generation and adjustment of the compensation current flowing in the compensation coil 23 and, optionally, for the detection of the secondary current flowing in the additional secondary winding 33, the compensation current sensor 15 comprises a second measuring circuit 37. The first measuring circuit 35 is connected by means of first connecting lines 39 to the secondary coils 21. The second measuring circuit 37 is connected by means of second connecting lines 41 to the excitation winding 31 and the compensation coil 23 and, optionally, to the additional secondary winding 33. The connecting lines 39, 41 are brought out of the winding housing 10 and the housing 9, and are led through the post insulator 5 to the terminal box 8, and from thence to the measuring circuits 35, 37.

The compensation current sensor 15 is deactivable. To this end, components of the second connecting lines 41 which connect the terminal box 8 to the second measuring circuit 37 are detachably connected to said terminal box 8, for example by means of a plug-in connection. Further to the release of these components of the second connecting lines 41 from the terminal box 8, the excitation winding 31, the optional additional secondary winding 33 and the compensation coil 23 are respectively short-circuitable, for example by means of a short-circuit plug connector 43, which is connectable to the terminal box 8 in place of said components of the second connecting lines 41.

Figure 3:
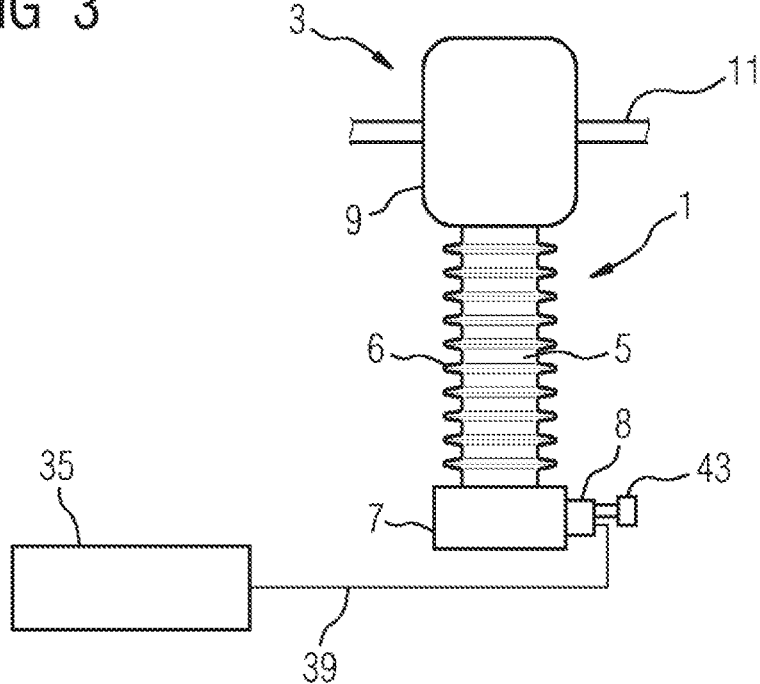
FIG. 3 shows a schematic representation of the current converter represented in FIG. 1, with the compensation current sensor deactivated.

FIG. 3 shows the current converter 1 with a short-circuit plug connector 43, which respectively short-circuits the excitation winding 31, the optional additional secondary winding 33 and the compensation coil 23.

The post insulator 5 is configured as a hollow insulator, and comprises a plurality of insulating shields 6, which are respectively arranged in an annular manner about a longitudinal axis of the post insulator 5. The post insulator 5 is formed, for example, from a ceramic material, or is configured as a tube of a glass fiber-reinforced plastic, on which silicone insulating shields 6 are arranged.

The winding housing 10 is electrically insulated vis-à-vis the housing 9. For example, the housing 9, to this end, is filled with an insulating gas, for example with sulfur hexafluoride or nitrogen, or with an insulating fluid, for example with an insulating oil, or with an insulating compound, for example with a silicone insulating compound.

The exemplary embodiment represented in the figures can be modified in a variety of ways. For example, the inductive alternating current sensor 13 can comprise a number of protective cores 17 and/or measuring cores 19 other than two. In particular, it can comprise no protective core 17 or no measuring core 19 whatsoever. The compensation current sensor 15 can further comprise a magnetometer 25 other than a fluxgate magnetometer, for example a magnetometer 25 with a Hall effect sensor 49 (see FIG. 4).

Figure 4:
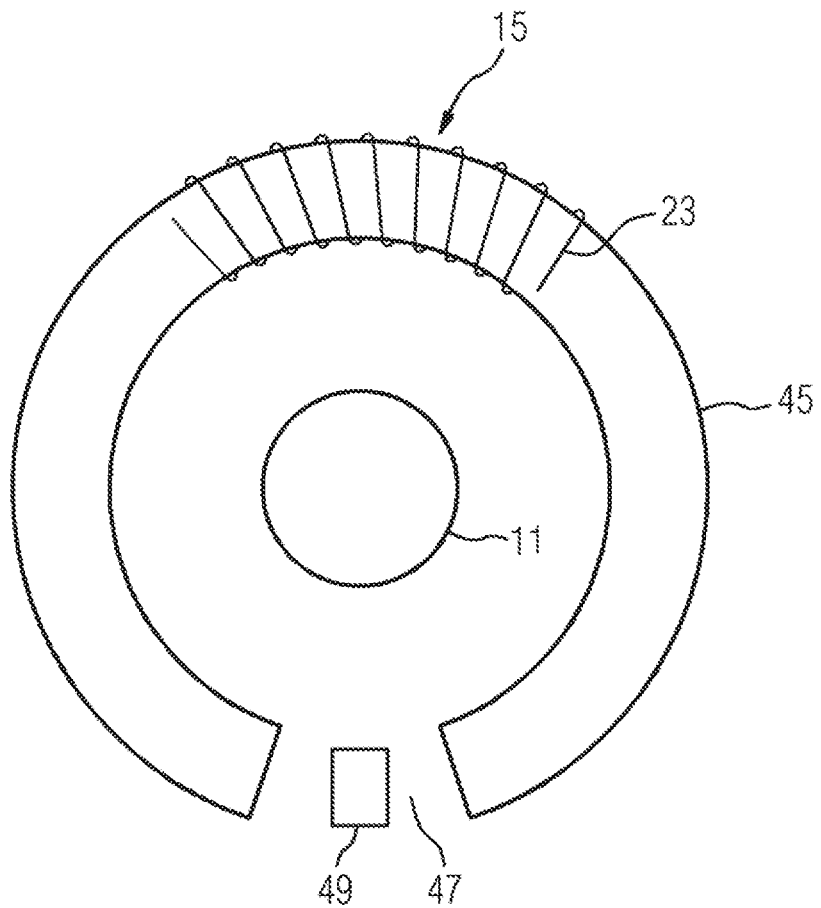
FIG. 4 shows a schematic representation of an exemplary embodiment of a compensation current sensor, having a Hall effect sensor.

FIG. 4 shows a schematic representation of an exemplary embodiment of a compensation current sensor 15, which comprises a magnet core 45 configured in an annular arrangement about the primary conductor 11 within the winding housing 10, about which the compensation coil 23 is wound, and which incorporates an air gap 47, in which a Hall effect sensor 49 is arranged. By means of the Hall effect sensor 49, the sum of the primary magnetic field which is generated by the primary conductor 11 and of the compensation magnetic field which is generated by the compensation coil 23 is detected at the location of the Hall effect sensor 49, and the setting of the compensation current flowing in the compensation coil 23 is adjusted such that said sum is cancelled out.

Although the invention has been described and illustrated in greater detail with reference to preferred exemplary embodiments, the invention is not limited by the examples disclosed, and further variations can be inferred herefrom by a person skilled in the art, without departing from the protective scope of the invention.

The invention claimed is:
1. A current converter, comprising:
a primary conductor;
a housing and through said housing said primary conductor is led;

an inductive alternating current sensor having at least one secondary coil which is disposed in said housing; and a compensation current sensor having a compensation coil disposed in said housing for producing a compensation magnetic field, the compensation magnetic field compensating a primary magnetic field produced by said primary conductor, said compensation current sensor further having a magnetometer for detecting a sum of the primary magnetic field and the compensation magnetic field, said compensation current sensor having a measuring circuit being disposed outside said housing and electrically connected to said compensation coil and said magnetometer.

2. The current converter according to claim 1, wherein said inductive alternating current sensor has at least one measuring core and/or at least one protective core.

3. The current converter according to claim 1, wherein said magnetometer is a fluxgate magnetometer.

4. The current converter according to claim 3, wherein said fluxgate magnetometer has two compensation cores configured in an annular configuration about the primary conductor within said housing, and an excitation winding wound in an inverse direction about said two compensation cores.

5. The current converter according to claim 3, wherein said fluxgate magnetometer has an additional core and an additional secondary winding, which are configured in an annular configuration about said primary conductor within said housing, said additional secondary winding and said compensation coil are wound about said additional core.

6. The current converter according to claim 1, wherein said magnetometer contains a Hall effect sensor.

7. The current converter according to claim 1, further comprising a winding housing disposed in said housing, and within said winding housing said at least one secondary coil and said compensation coil are disposed.

8. The current converter according to claim 7, wherein said winding housing is electrically insulated vis-à-vis said housing.

9. The current converter according to claim 1, wherein said housing is filled with an insulating gas or an insulating fluid, or with an insulating compound.

10. The current converter according to claim 1, wherein said inductive alternating current sensor contains a further measuring circuit, which is disposed outside said housing and is electrically connected to each said secondary coil.

11. The current converter according to claim 1, wherein said compensation current sensor is deactivable.

12. The current converter according to claim 1, further comprising a post insulator, and upon said post insulator said housing is disposed.

13. A current converter, comprising:

a primary conductor;

a housing and through said housing said primary conductor is led;

an inductive alternating current sensor having at least one secondary coil which is disposed in said housing; and a compensation current sensor having a compensation coil disposed in said housing for producing a compensation magnetic field, the compensation magnetic field compensating a primary magnetic field produced by said primary conductor, said compensation current sensor further having a magnetometer with a Hall effect sensor for detecting a sum of the primary magnetic field and the compensation magnetic field, said compensation current sensor further having a magnet core configured in an annular configuration about said primary conductor, within said housing, and about said magnet core said compensation coil being wound, and said magnet core having an air gap formed therein and in said air gap said Hall effect sensor is disposed.

* * * * *